United States Patent [19]
Woodruff et al.

[11] Patent Number: 5,525,533
[45] Date of Patent: Jun. 11, 1996

[54] METHOD OF MAKING A LOW VOLTAGE COEFFICIENT CAPACITOR

[75] Inventors: Richard L. Woodruff, Colorado Springs; Rick C. Jerome, Monument, both of Colo.

[73] Assignee: United Technologies Corporation, Hartford, Conn.

[21] Appl. No.: 385,522

[22] Filed: Feb. 8, 1995

Related U.S. Application Data

[60] Division of Ser. No. 226,803, Apr. 12, 1994, which is a continuation-in-part of Ser. No. 72,653, Jun. 3, 1993, Pat. No. 5,344,785.

[51] Int. Cl.$^6$ .............................. H01L 21/70; H01L 27/00
[52] U.S. Cl. .............. 437/60; 437/62; 437/919; 437/47; 148/DIG. 14
[58] Field of Search ................... 437/47, 52, 60, 437/61, 62, 919; 148/DIG. 14, DIG. 150

[56] References Cited

U.S. PATENT DOCUMENTS

| | | | |
|---|---|---|---|
| 4,631,803 | 12/1986 | Hunter et al. | 148/DIG. 50 |
| 4,980,748 | 12/1990 | Hozumi et al. | 357/50 |
| 5,036,020 | 7/1991 | Tigelaar | 437/60 |
| 5,120,572 | 6/1992 | Kumar | 437/60 |
| 5,273,915 | 12/1993 | Hwang et al. | 437/60 |
| 5,275,974 | 1/1994 | Ellul et al. | 437/919 |
| 5,356,822 | 10/1994 | Lin et al. | 437/62 |
| 5,376,560 | 12/1994 | Aronowitz et al. | 437/62 |
| 5,409,846 | 4/1995 | Hirose | 437/60 |

FOREIGN PATENT DOCUMENTS

| | | | |
|---|---|---|---|
| 0122676 | 5/1990 | Japan | 437/919 |
| 6314685 | 8/1994 | Japan | 437/919 |

*Primary Examiner*—Tuan H. Nguyen
*Attorney, Agent, or Firm*—Ozer M. N. Teitelbaum

[57] ABSTRACT

The present invention teaches a low voltage coefficient MOS capacitor, and a method of making such a capacitor, having substantially uniform parasitic effects over an operating voltage range and a low voltage coefficient. The capacitor comprises a first conductive layer superjacent a silicon on insulator ("SOI") substrate. The first conductive layer comprises heavily doped silicon having a first conductivity type, while the substrate comprises a second conductivity type. Further, the capacitor comprises an isolation trench surrounding the first conductive layer filled with a dielectric material. Positioned superjacent the first conductive layer is a dielectric layer, thereby forming a dielectric shell on all sides of the first conductive layer except for its upper face. Moreover, a second conductive layer is positioned superjacent the dielectric layer to form a low voltage coefficient capacitor.

10 Claims, 2 Drawing Sheets

METHOD OF MAKING A LOW VOLTAGE COEFFICIENT CAPACITOR

RELATED APPLICATIONS

This application is a division of a pending application, serial No. 08/226,803, filed on Apr. 12, 1994, which is a continuation in part ("CIP") of a patent application, Ser. No. 08/072,653, filed on Jun. 3, 1993, now U.S. Pat. No. 5,344,785, issued on Sep. 6, 1994.

TECHNICAL FIELD

This invention relates to the field of semiconductor devices, and more particularly to low voltage coefficient metal oxide semiconductor capacitors.

BACKGROUND ART

In the semiconductor industry, capacitors having linear capabilities are of critical importance for both digital and analog devices. Presently, two capacitors designs are commonly employed in CMOS technology.

Referring to FIG. 1, a first capacitor 10 known for its linear capabilities is shown. Capacitor 10 comprises a polysilicon top plate 12 and a heavily doped diffusion region forming a bottom plate 14 on a substrate 18. Both top and bottom plates are separated by a dielectric layer 16 comprising a gate oxide.

By the arrangement of the structure of FIG. 1, a capacitor having linear capabilities is formed. However, this configuration is substantially limited. First, capacitor 10 comprises a parasitic capacitance between the heavily doped diffusion region forming a bottom plate 14 and the substrate 18. This parasitic capacitance varies over the voltage applied. As such, the overall capacitance comprises a voltage dependent characteristic.

Referring to FIG. 2, a second capacitor 20 known for its linear capabilities is shown. Second capacitor 20 comprises a first and second conductive plate, 22 and 24, both formed superjacent a field oxide region 26. First and second conductive plate, 22 and 24, both preferably comprise polysilicon and are separated by a dielectric layer 28.

The structure of FIG. 2 overcomes some of the disadvantages of the device illustrated in FIG. 1. The impact of the parasitic effects of the configuration of capacitor 20 of FIG. 2 is diminished by positioning the bottom plate 24 over field oxide region 26, as opposed to substrate 18 of FIG. 1. By doing so, capacitor 20 comprises substantially reduced voltage dependent parasitic capacitance characteristics.

However, the capacitor structure of FIG. 2 is also limited. First, in order to fabricate capacitor 20, a double polysilicon process is needed to form both upper and lower plates 22 and 24. Second, the dielectric layer 28 is formed by depositing a thin silicon-dioxide layer. This also requires several additional steps beyond those required in the typical single polysilicon process.

Given the limitations of these known structures, there remains a need for a linear capable capacitor having substantially reduced voltage dependent parasitic capacitance characteristics. Further, a demand remains for a linear capable capacitor requiring few additional processing steps to achieve this reduction in voltage dependent parasitic capacitance.

DISCLOSURE OF THE INVENTION

The primary, advantage of the present invention is to provide a method of making a linear capable capacitor structure, having substantially reduced voltage dependent parasitic capacitance characteristics.

In the present invention, a method of fabricating a capacitor having substantially uniform parasitic effects over an operating voltage range and a low voltage coefficient is disclosed. First, a first conductive layer is formed having an exposed upper surface and a dielectric shell isolating each remaining surface. This dielectric shell is formed superjacent a semiconductor substrate. Second, a dielectric layer is formed superjacent the conductive layer. Third, a second conductive layer is formed superjacent the dielectric layer, thereby forming a capacitor.

BRIEF DESCRIPTION OF THE DRAWINGS

The present invention will be better understood from reading the following description of non-limited embodiments, with reference to the attached drawings, wherein below.

DETAILED DESCRIPTION OF THE INVENTION

The steps of the present Invention related to the construction of a low voltage coefficient MOS capacitor are illustrated in sequence of FIGS. 3 through 8. Each Figure illustrates the results of one or more steps in the method of the present invention, thereby reducing the number of Figures Incorporated herein.

Figure 3:
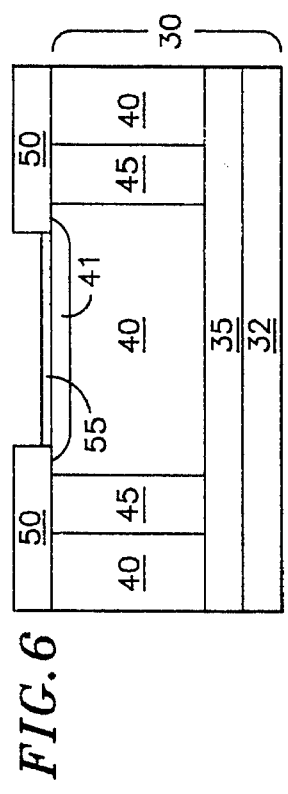
FIG. 3 illustrates a first step according to an embodiment of the present invention.

Referring to FIG. 3, an existing semiconductor structure 30 is depicted according to a first step of the present invention. Semiconductor 30 preferably comprises a stacked silicon on insulator ("SOI") type substrate. As such, stacked SOI substrate 30 comprises a semiconductor substrate 32, a first dielectric layer 35 positioned superjacent substrate 32, and a first conductive layer 40 positioned superjacent first dielectric layer 35. SOI substrates inherently comprise radiation hardened characteristics. Further, SOI substrates are substantially immune to noise. This is realized by the fact that SOI substrates provide greater isolation, as well as reduced parasitic effects.

In the preferred embodiment, first dielectric layer 35 comprises an oxide layer having a thickness substantially in the range of 0.3 µm to 3 µm. Furthermore, first conductive layer 40 preferably comprises heavily doped silicon to increase its conductivity and has a preferred thickness substantially in the range of 0.1 μm to 3 μm.

In providing semiconductor structure 30, the top portion of first conductive layer 40 is implanted and annealed to form a heavily doped P or N type conductive layer. The thickness of layer 40 may then be increased by means of epitaxial deposition. To achieve this result, an additional implant of the same species is performed to maintain both the level of doping and the conductivity type. The preferred final thickness of layer 40 in this embodiment is approximately 2 μm. Nonetheless, the final thickness can be substantially in the range of 0.1 μm to 10 μm.

Figure 4:
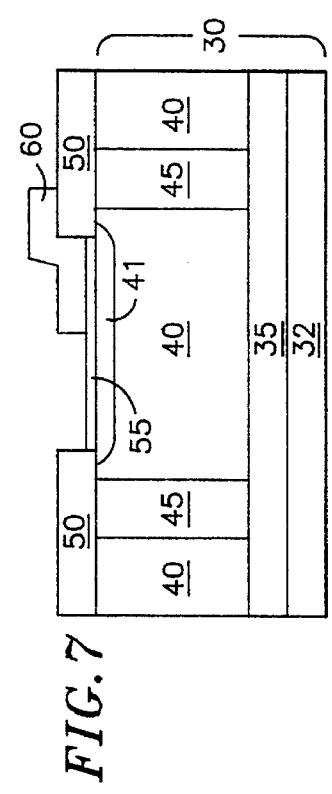
FIG. 4 illustrates a second step according to an embodiment of the present invention.

Referring to FIG. 4, a semiconductor structure is depicted according to a second step of the present invention. Upon completion of the epitaxial deposition, an isolation trench 45 is formed surrounding the layer 40. Isolation trench 45 comprises a total depth substantially equivalent to that of layer 40, as trench 45 substantially exposes the upper surface of dielectric layer 35. In the preferred embodiment, the width of isolation trench 45 is approximately 1 μm. However, the width of the trench can be substantially in the range of 0.2 μm to 4 μm.

Isolation trench 45 is fabricated by means of an anisotropic dry etch step. An anisotropic etch approach is performed to maintain the angle of the sidewalls to be substantially in the range of 85° and 90°. The etchant employed etches through layer 40, stopping at first dielectric layer 35.

Once formed, isolation trench 45 is filled with either a dielectric material alone or a combination of a dielectric material and a semiconductor material. In the preferred embodiment, this material comprises a thermal oxide, a deposited oxide, and an undoped polycrystalline silicon ("polysilicon") filling.

As a result of filling isolation trench 45 with either a dielectric material or a combination of dielectric and semiconductor materials, a dielectric shell is formed. This shell provides dielectric isolation for each surface of layer 40 except for its upper surface.

Figure 5:
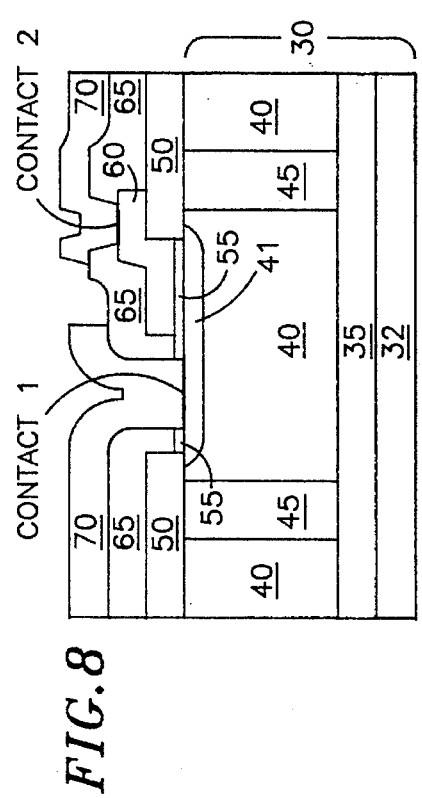
FIG. 5 illustrates a third step according to an embodiment of the present invention.

Referring to FIG. 5, either during or after filling isolation trench 45, a second dielectric layer 50 preferably comprising field oxide is deposited or thermally grown superjacent to layer 40 and isolation trench 45. It should be noted that second dielectric layer 50 comprises a thickness substantially in the range of 4000 Å to 8000 Å. In the preferred embodiment, however, this thickness is approximately 6000 Å.

Once second dielectric layer 50 is formed, an active region is patterned and a section of second dielectric layer 50 is removed according to the pattern, thereby exposing a portion of layer 40. Subsequently, by means of several steps known to one of ordinary skill in the art, such as applying mask step and patterning, the upper surface region of layer 40 is implanted with the same dopant conductivity type as in layer 40. The dose of this implant is substantially in the range of $5 \times 10^{14}$ to $1 \times 10^{16}$, though $2 \times 10^{15}$ is preferred. As a result of this implant step, a heavily doped region 41 is formed in an upper portion of layer 40.

Figure 6:
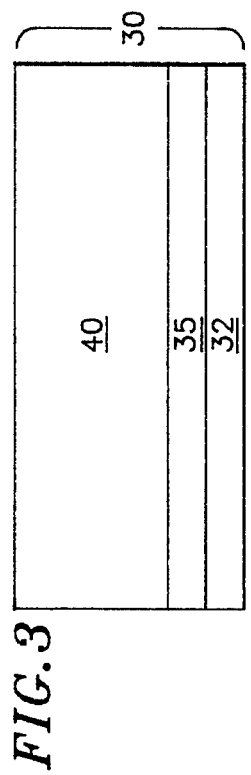
FIG. 6 illustrates a fourth step according to an embodiment of the present invention.

Referring to FIG. 6, a semiconductor structure is depicted according to a fourth step of the present invention. Upon completing the fourth step described herein or an equivalent step(s) thereof, a third dielectric layer 55 is formed superjacent to exposed portion of layer 40. Third dielectric layer 55 preferably comprises a thermally grown oxide and is also referred to as a gate oxide layer. As such, third dielectric layer 55 comprises a thickness substantially in the range of 100 Å to 500 Å. However, the preferred thickness of third dielectric layer 55 is approximately 250 Å.

Figure 7:
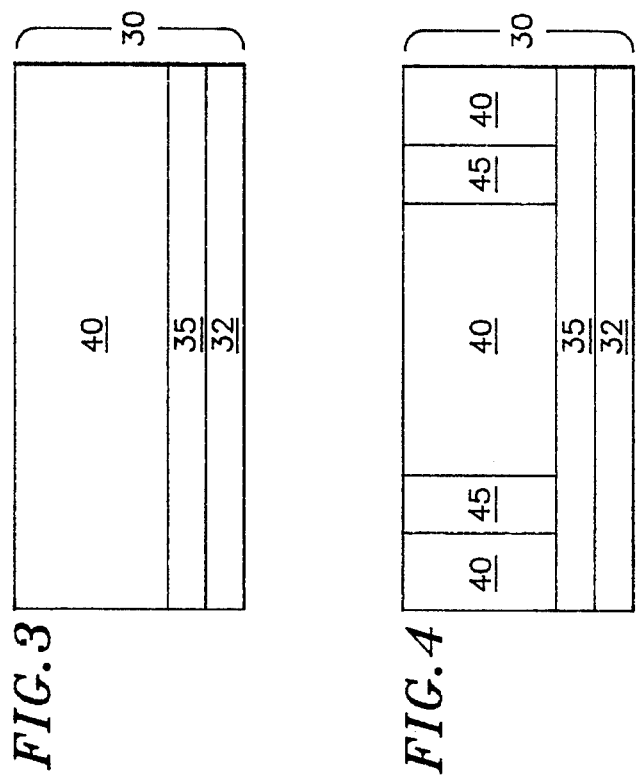
FIG. 7 illustrates a fifth step according to an embodiment of the present invention.

Referring to FIG. 7, a semiconductor structure is depicted according to a fifth step of the present invention. Upon completing the previous steps described herein or their equivalents, a second conductive layer 60 is formed superjacent third dielectric layer 55 and a portion of second dielectric layer 50. Second conductive layer 60 preferably comprises heavily doped polysilicon to increase its conductivity. Second conductive layer 60 comprises a thickness substantially in the range of 1500 Å to 5500 Å. However, layer 60 has a preferred thickness of approximately 4500 Å.

Second conductive layer 60 is realized by first patterning the transistor gate region. Subsequently, sections of second conductive layer 60 are removed according to the pattern to expose a portion of layer 41 and thereby form the final shape of second conductive layer 60, as illustrated in FIG. 7.

Figure 8:
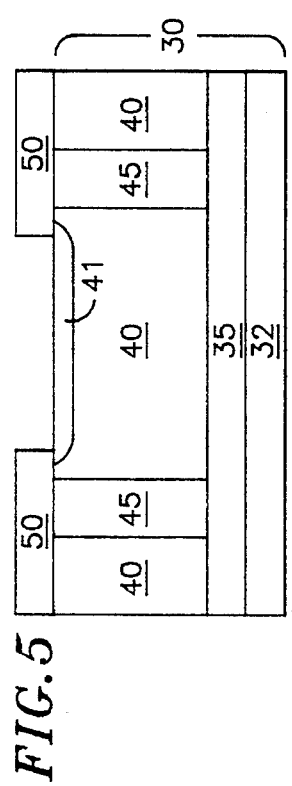
FIG. 8 illustrates the capacitor structure resulting from a sixth step of the present invention.

Referring to FIG. 8, a semiconductor structure is depicted according to a sixth step of the present invention. Here, a fourth dielectric layer 65 is deposited superjacent the resultant semiconductor structure of FIG. 7. Areas for electrical contact are then patterned and sections of fourth dielectric layer 65 are removed to expose both a portion of layer 41 for a first contact, Contact 1, and a portion of layer 60 for a second contact, Contact 2.

Once portions of layer 41 and 60 are exposed for both contacts, Contacts 1 and 2, a metal layer 70 is deposited and patterned to provide electrical connections for layer 41 and layer 60. These electrical connections form the top and bottom of the capacitor electrodes.

Figure 1:
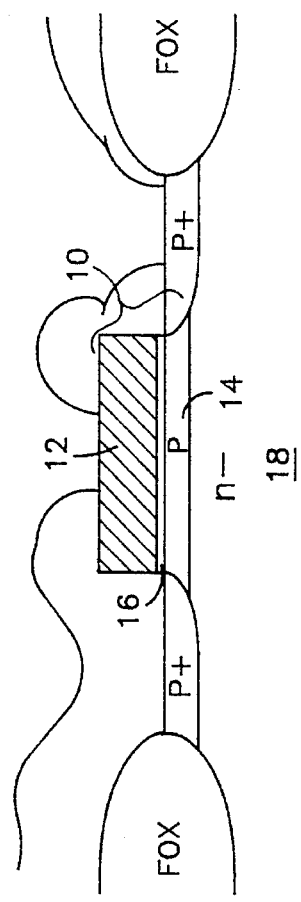
FIG. 1 illustrates a first capacitor known in the art for its linear capabilities.
Figure 2:
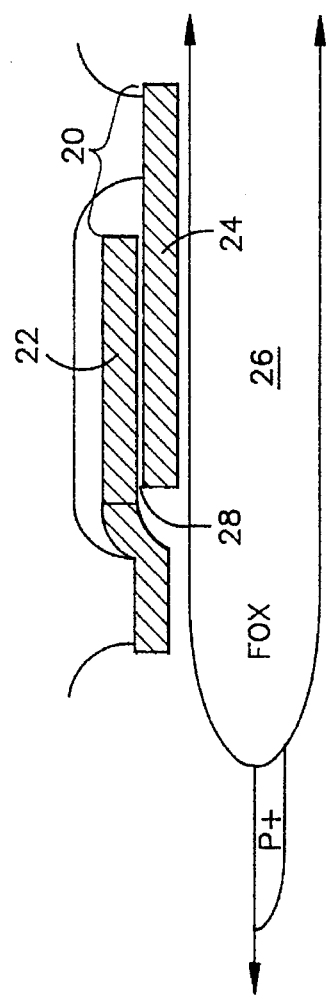
FIG. 2 illustrates a second capacitor known in the art for its linear capabilities.

As a result of the steps disclosed herein, a capacitor structure is formed. This capacitor comprises the benefit of a lower voltage coefficient on a single level polysilicon process. The lower voltage coefficient is achieved by the elimination of the parasitic voltage dependent junction capacitance that results from the junction structure of the existing single level polysilicon capacitor shown in FIG. 1. With the elimination of this junction, the resultant capacitance of this invention is determined only by conductor-insulator-conductor structures and is therefore much less sensitive to voltage variation.

While the particular invention has been described with reference to illustrative embodiments, this description is not meant to be construed in a limiting sense. It is understood that although the present invention has been described in a preferred embodiment, various modifications of the illustrative embodiments, as well as additional embodiments of the invention, will be apparent to persons skilled in the art upon reference to this description without departing from the spirit of the invention, as recited in the claims appended hereto. It is therefore contemplated that the appended claims will cover any such modifications or embodiments as fall within the true scope of the invention.

All of the U.S. Patents cited herein are hereby incorporated by reference as if set forth in their entirety.

What is claimed is:

1. A method of fabricating a capacitor having substantially uniform parasitic effects over an operating range, said method comprising the steps of:

forming a first conductive layer superjacent a buried oxide layer, said buried oxide layer being formed superjacent a semiconductor substrate, said first conductive layer comprising heavily doped silicon and having a first conductivity type and said substrate comprising a second conductivity type opposite of said first conductivity type, said first conductive layer having an exposed upper surface region and a thickness substantially in the range of 0.1 μm to 10 μm;

implanting said exposed upper surface region of said first conductive layer with a dopant having said first conductivity type;

forming a trench surrounding said first conductive layer, said trench having a width substantially in the range of 0.2 µm to 4 µm and a thickness substantially equivalent to said first conductive layer;

filling said trench with a dielectric material comprising silicon dioxide or silicon dioxide in combination with polysilicon;

forming a gate oxide layer superjacent said exposed upper surface of said first conductive layer, said gate oxide layer having a thickness substantially in the range of 4000 Å to 8000 Å; and forming a second conductive layer superjacent said gate oxide layer, said second conductive layer comprising heavily doped polysilicon and having a thickness substantially in the range of 1500 Å to 5500 Å, thereby forming a capacitor having substantially uniform parasitic effects over an operating voltage range of the semiconductor.

2. A method of fabricating a capacitor on a semiconductor substrate, comprising the steps of:

depositing a first dielectric layer on the substrate;

forming a first conductive layer superjacent said first dielectric layer, said first conductive layer having an exposed major surface;

etching an isolation trench through said first conductive layer to said first dielectric layer, said trench extending along said exposed major surface in a closed path which is circumferential to a segment of said first conductive layer, said segment forming a first plate of the capacitor;

filling said trench with a trench dielectric material to create, in combination with said first dielectric layer, a dielectric shell surrounding said first plate on all but said exposed major surface thereof;

forming a second dielectric layer superjacent a first surface portion of said exposed major surface of said first plate, a second surface portion thereof remaining exposed; and forming a second conductive layer superjacent said second dielectric layer in a manner which causes said second surface portion of said major surface to remain exposed, said second conductive layer providing a second plate of the capacitor, whereby a capacitor is formed having substantially uniform parasitic effects over an operating voltage range of the semiconductor.

3. The method of claim 2 wherein said trench dielectric material comprises a silicon dioxide filling.

4. The method of claim 2, wherein said step of forming said second dielectric layer comprises the step of:

thermally growing said second dielectric layer.

5. The method of claim 4, wherein said second dielectric layer comprises silicon dioxide.

6. The method of claim 2, wherein said first conductive layer comprises heavily doped silicon having a first conductivity type.

7. The method of claim 6, further comprising the step of:

implanting said first and second surface portions of said first plate with a dopant having said first conductivity type, prior to said step of forming said second dielectric layer.

8. The method of claim 2, wherein said second conductive layer comprises heavily doped polysilicon.

9. The method of claim 2 wherein said step of etching includes the use of an anisotropic dry etch sufficient to maintain the angle of the trench sidewalls in the range of from 85 degrees to 90 degrees.

10. The method of claim 2, wherein said trench dielectric material comprises a filling of silicon dioxide in combination with polysilicon.

* * * * *